United States Patent [19]
Vukelic

[11] Patent Number: 5,286,519
[45] Date of Patent: Feb. 15, 1994

[54] FLUID DISPERSION HEAD

[75] Inventor: Michael Vukelic, Felton, Calif.

[73] Assignee: LSI Logic Corporation, Milpitas, Calif.

[21] Appl. No.: 856,476

[22] Filed: Mar. 24, 1992

Related U.S. Application Data

[62] Division of Ser. No. 720,874, Jun. 25, 1991, abandoned.

[51] Int. Cl.⁵ .................. B05D 5/12; C23C 16/00
[52] U.S. Cl. .................. 427/99; 427/248.1;
427/255; 427/255.1; 427/255.3; 427/255.2;
118/715; 118/725
[58] Field of Search .......... 427/248.1, 255, 255.1,
427/255.2, 255.3, 99; 239/553.3, 500, 504, 524,
590.3; 118/715, 719, 725

[56] References Cited

U.S. PATENT DOCUMENTS

| 3,517,643 | 6/1970 | Goldstein et al. | 118/715 |
| 3,603,284 | 9/1971 | Garnache | 118/48 |
| 3,854,443 | 12/1974 | Baerg | 118/49 |
| 4,656,055 | 4/1987 | Dwyer | 427/89 |
| 4,825,808 | 5/1989 | Takahashi et al. | 118/719 |
| 4,924,936 | 5/1990 | McKown | 118/715 |
| 5,040,046 | 8/1991 | Chhabra et al. | 427/255.2 |

FOREIGN PATENT DOCUMENTS

| 60-116126A | 6/1985 | Japan | 21/205 |
| 62-81019A | 4/1987 | Japan | 21/205 |
| 62-91496 | 4/1987 | Japan | 21/20 |

OTHER PUBLICATIONS

"Webster's Ninth New Collegiate Dictionary", p. 1304, 1986.

Primary Examiner—Shrive Beck
Assistant Examiner—David M. Maiorana
Attorney, Agent, or Firm—Gerald E. Linden; Michael D. Rostoker

[57] ABSTRACT

A fluid distribution head of this invention includes a chamber for fluid flow including a perforated plate. The perforated plate is internally supported by a structural support to avoid deformation of the plate.

22 Claims, 6 Drawing Sheets

FLUID DISPERSION HEAD

This is a divisional of application of U.S. Ser. No. 07/720,874 filed: Jun. 25, 1991, now abandoned.

TECHNICAL FIELD

This invention relates to an apparatus which has a fluid inlet and a multiplicity of fluid outlets through which the fluid is dispersed, such as a vapor deposition head. The multiplicity of fluid outlets generally comprise perforations through a plate. The fluid can be a liquid or a gas, and is preferably a vaporous gas.

BACKGROUND OF THE INVENTION

Integrated circuits are made using silicon wafers. The silicon wafers are processed into integrated circuits using a variety of techniques to form transistors and other circuit elements upon the silicon wafer. These processes involve multiple steps in which layers of materials are selectively deposited and/or selectively etched away. One of the steps commonly used is Chemical Vapor Deposition (CVD), in which a very thin layer of a metal or other material is deposited upon the surface of the silicon wafer. Low Pressure Chemical Vapor Deposition (LPCVD) is a process in which chemical vapor deposition takes place under a vacuum or a partial vacuum.

CVD machines generally include multiple stations at which sequential depositions or other actions are performed. Because of the small size of the traces needed for integrated circuits, proper and consistent alignment and registration, and the uniform deposition of materials, are crucial to the quality of the finished product.

CVD devices must carefully control the distribution and flow characteristics of the fluid which includes the metal or other material deposited. In silicon wafer technology, the fluid is generally admitted into the chamber of a fluid distribution head through an opening which terminates an inlet tube. The fluid stream encounters a deflector plate within the chamber which acts to disperse the fluid stream throughout the distribution head. The dispersed fluid then exits the distribution head through a multiplicity of openings in a perforated plate. The axis of the perforated plate is generally perpendicular to the axis of the inlet tube.

Temperature within the distribution head and at the surface of the wafer must be carefully controlled. For example, when a metal oxide film is deposited onto a silicon wafer using a Novellus Concept One (Novellus Systems, Inc, San Jose, Calif.) LPCVD machine, the temperature at the wafer is maintained at 400° C. ±8° C. Extreme temperatures such as these can cause the perforated plate to deform, and to deflect from the planar configuration. When the perforated plate becomes deformed it alters the distribution pattern of the fluid distribution head, causing the fluid to be unevenly applied to the silicon wafer. When deformation becomes excessive it can also disrupt the wafer registration, so that the silicon wafer misfeeds across the fluid distribution head. Either of these occurrences can cause the completed integrated circuit to fail.

Maintaining fluid distribution heads in an undeformed configuration has proven to be a problem which has been difficult and expensive to solve. For example, the eight fluid distribution heads which were original equipment in a commercially available LPCVD device demonstrated deformation after only three months of use. All eight heads must be replaced as a set, at a cost of $10,000 to $12,000 per set. The LPCVD machine must be shut down while the replacement takes place, with attendant repair and down-time costs.

One approach to prolonging the useful life of the fluid distribution heads has been to thicken the perforated plate. While this has prolonged the useful life of the heads somewhat (bowing takes place after four to six months rather than after three months) it has not solved the deformation problem, or reduced the expense of frequent replacement of the fluid distribution heads.

SUMMARY OF THE INVENTION

A fluid distribution head of this invention includes a chamber for fluid flow defined by a housing and including an aperture for the intake of fluids and a perforated plate opposite the aperture for the discharge of fluids. A baffle is located within the chamber and between the aperture and the perforated plate, the baffle acting to disperse fluid which enters the chamber. A support within the chamber structurally connects the housing and the perforated plate, and prevents deformation or sagging of the perforated plate under extremes of temperature. The support can be, for example, one or more rod, an internal wall, and the like. The support does not substantially impede the flow of fluids through the chamber.

In an especially preferred embodiment, the fluid distribution head is a chemical vapor deposition head. Chemical vapor deposition heads find use, for example, in low pressure, atmospheric pressure, and high pressure chemical vapor deposition systems. Chemical vapor deposition systems preferred for use with the heads of the subject invention operate in a temperature range of from less than 20° C. to more than 1400° C., more generally about 100° C. to about 600° C., and more preferably in the range of about 200° C. to about 500° C.

The fluid dispersed by a chemical vapor deposition system is generally a gas, although other fluids (such as liquids) can be used.

Methods of use of the improved fluid distribution heads of the subject invention are disclosed. CVD apparatus including the improved fluid distribution heads of the subject invention are also disclosed. The improved fluid distribution heads of the subject invention find particular use in the manufacture of integrated circuits.

DISCLOSURE OF THE INVENTION INCLUDING BEST MODE

This invention pertains to fluid distribution heads, and more particularly to fluid distribution heads used in vapor deposition processes such as low-pressure chemical vapor deposition processes.

Figure 1A:
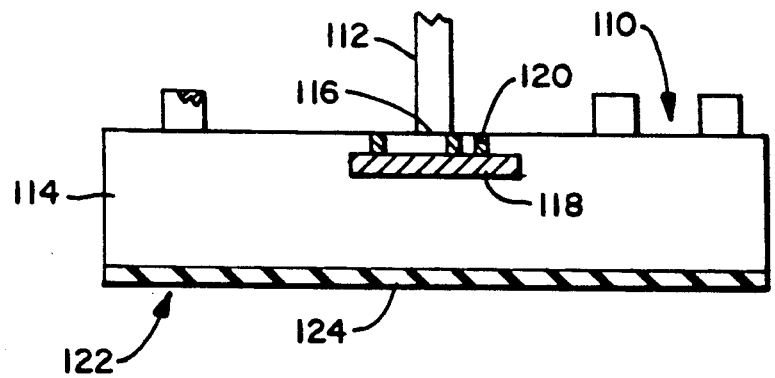
FIG. 1a shows a cross sectional view of a prior art fluid distribution head in the condition in which it is installed.

An unused fluid distribution head of the prior art 110 is shown in FIG. 1a. An inlet shaft 112 provides a fluid to an internal chamber 114 through the inlet aperture 116. After a fluid stream enters the chamber 114 through the inlet aperture 116 it contacts the internal baffle 118 and is dispersed throughout the fluid distribution head 110. The baffle 118 is held in place by one or more (generally three or more) baffle supports 120.

The fluid flow within the chamber 114 is designed to provide a uniform flow at the outer surface 122 of the perforated plate 124. The fluid so delivered is used, for example, to cleanse a surface, or to deposit a substance within the fluid to a surface.

Figure 1B:
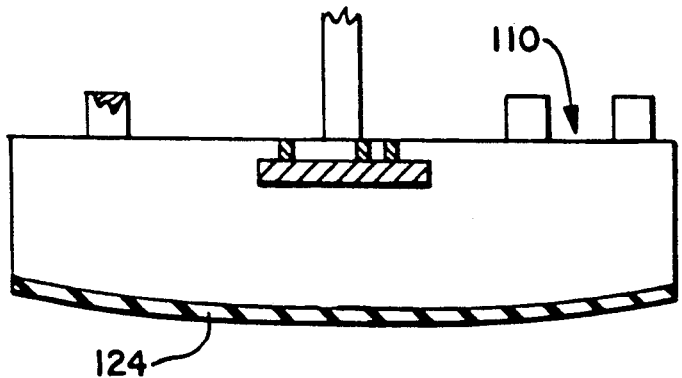
FIG. 1b shows similar view when the fluid distribution head is in failure mode, after three to six months use at approximately 400° C.

One area in which a fluid distribution head of this type finds particular use is in the chemical vapor deposition of substances, such as in the making of integrated circuits. However, due to the high temperatures used in CVD devices (200° C., to 600° C., for example), the perforated plate 124 can assume a deformed and arced configuration, as shown in FIG. 1b. This deformation can occur in as little as three or four months at temperatures of approximately 400° C.

Figure 2A:
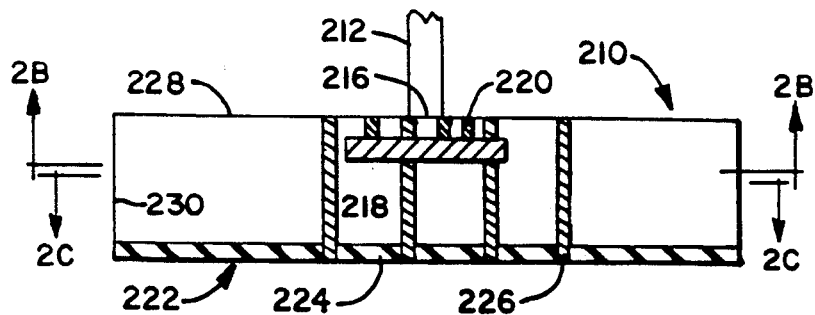
FIG. 2a shows a cross sectional view of a fluid distribution head.
Figure 2B:
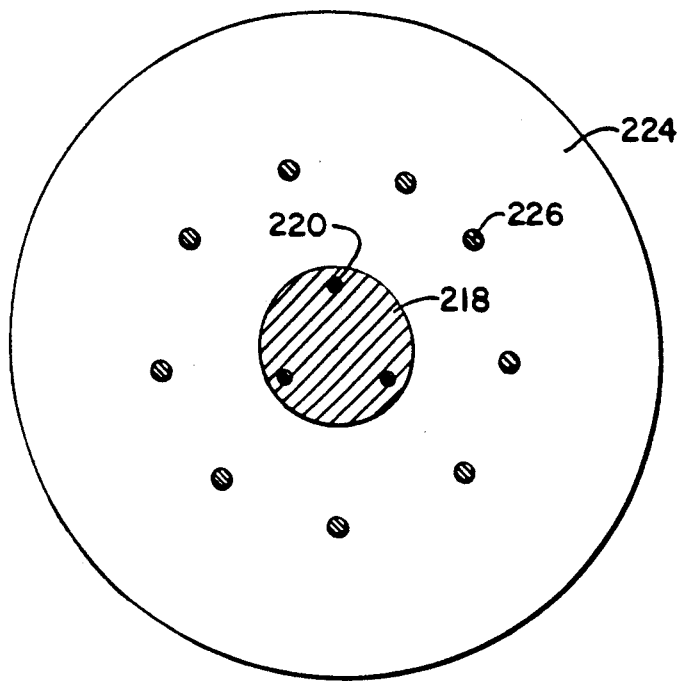
FIG. 2b demonstrates a view of the device of FIG. 2a taken along line 2b—2b. Similarly, FIG. 2c demonstrates a view of the device of FIG. 2a taken along line 2c—2c.
Figure 2C:
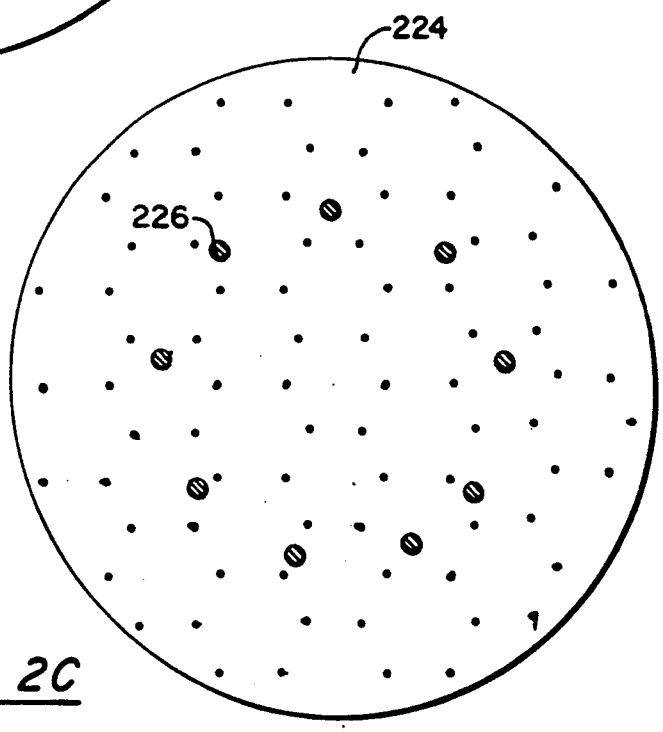
FIG. 2 shows a fluid distribution head of this invention.

FIGS. 2a, 2b and 2c show alternate views of a fluid distribution head of this invention. FIG. 2a shows a cross sectional view of a fluid distribution head 210. The fluid distribution head can be made of any one or more materials such as a metal, polymer, plastic, and the like, which shows sufficient structural integrity under the conditions of use. In a preferred embodiment when the fluid distribution head is used for CVD, the fluid distribution head is made of aluminum.

The inlet shaft 212 can be an integral part of the fluid distribution head 210, or it can be attached to the fluid distribution head 210 at the inlet aperture 216. If the inlet shaft 212 is affixed to the fluid distribution head 210, it can be affixed by any appropriate means, for example by pressure-fitting, screw or threaded attachment, glue, solder, and the like. The inner diameter of the inlet shaft 212 can act as the inlet aperture 216.

The baffle 218 acts to disperse the fluid stream which enters the chamber 214. Any barrier which acts to effectively disperse the fluid stream is appropriate. For example, a sieve, plate, or screen can function as the baffle 218.

The baffle 218 can be held in place by one or more (usually three or more) baffle supports 220. The baffle supports are generally placed equidistant from one another and at a common distance from the center of the baffle. The baffle supports can have any desired configuration (such as one or more column having a round, triangular, square, rectangular, eccentric or other cross-section; one or more wall, or the like). The baffle supports preferably minimize impedance of the fluid dispersion. Preferably, the baffle supports act to facilitate the dispersion of the fluid throughout the chamber 214.

Fluids which can be delivered using a fluid dispensing head of the subject invention include gases and liquids. Gases include vapors, which are gaseous dispersions of one or more substances which are liquid or solid in their normal state, i.e., at standard temperature and pressure. One specific and preferred use for the fluid dispensing head of the subject invention is in the area of chemical vapor deposition (CVD) to deposit materials onto silicon wafers for the manufacture of integrated circuits. Materials which are commonly deposited using CVD procedures include silane based oxides, doped oxides, tetraethylorthosilicate (TEOS) oxides, nitrides, oxynitrides, tungsten, UV transparent nitride films, and silicon dioxide. Low pressure CVD techniques are especially used to deposit tungsten, nitrides, oxidinitrides, and TEOS, for example.

The fluid flow within the chamber 214 is designed to provide a uniform flow at the outer surface 222 of the perforated plate 224. The exact composition and size parameters of the perforated plate will vary with the specific application. For example, the perforated plate can be a metal such as aluminum, steel, and the like, or it can be a polymeric or plastic substance. For applications including CVD it is often preferred to use a perforated plate made primarily of aluminum, as it combines good milling and manufacture properties with light weight and good temperature characteristics. While the perforated plate can have any circumferential shape (such as square or rectangular, ovoid, ellipsoid, asymmetrical, and the like), it is generally preferred that the perforated plate be round. A round plate optimizes the fluid flow dynamics and contributes to the uniformity of fluid dispersion across the outer surface of the perforated plate.

The perforated plate will generally have a multiplicity of perforations. The size, spacing, and arrangement of the perforations will vary with the specific use of the fluid distribution head. If the perforated plate is circular it may be desirable to have a pattern of perforations which are in a circular layout around the plate. Alternately, the perforations can be arranged in a grid or honeycomb pattern, or they can be arranged randomly.

One or more internal support 226 connects the perforated plate 224 to one or more wall of the unit. The internal support can extend between the perforated plate 224 and any of the backplate 228 (as shown in FIG. 2), a side wall 226 (as shown in FIG. 3), or the baffle plate (as shown in FIG. 4). The internal support 226 can be a separate unit which is structurally connected at each end; it can be an extension of the perforated plate which is structurally connected at the backplate, a side wall, or the baffle plate; or it can be an extension of the backplate, a side wall (as shown in FIG. 3), or the baffle plate (as shown in FIG. 4) which is structurally connected to the perforated plate. The internal support 226 can be one or more pins or columns. When multiple pins are present an especially preferred embodiment includes nine pins arranged in a circular pattern. An alternate embodiment includes three pins.

The internal support 226 acts to stabilize the perforated plate against distortion from the planar. The internal support generally supports the perforated plate at or near the center of the perforated plate. When the perforated plate is a circle, the internal support is structurally affixed at the center (as shown in FIG. 4), near the center (as shown in FIG. 2), of from the perimeter inward toward the center (as shown in FIG. 3). At least some portion of the supporting structure is generally located within the inner ⅔ of the perforated plate. Thus, a circular plate having a radius r will generally have some supporting structure within a circle bounded by $(2r/3)$. More preferably, there will be some supporting structure within a circle bounded by $(r/2)$, i.e., closer to the center of the perforated plate than to the perimeter of the plate.

The fluid distribution head is usually manufactured in two or more discrete subunits, which are then joined (such as by soldering). Generally a backplate 228 forms the basis of one subunit. The baffle plate 218 and the baffle supports 220 are joined to the backplate. The perforated plate is generally a separate subunit. The side walls 230 can be part of the subunit with the backplate, part of the subunit with the perforated plate, or they can be a separate subunit. The discrete subunits are joined. They can be joined by any appropriate means, for example by pressure-fitting, by integrating threads, by gluing, soldering, and the like.

FIG. 2b demonstrates a view of the device of FIG. 2a taken along line 2b—2b. The backplate 226 and the baffle plate 218 are shown. Also shown the ends of the baffle supports 220 where they are joined through the baffle plate 218. Shown in cross-sectional view are nine internal supports 226 which extend between the perforated plate and the backwall.

FIG. 2c demonstrates a view of the device of FIG. 2a taken along line 2c—2c. The perforated plate 224 is shown, as are cross-sectional views of the nine internal supports 226 which extend between the perforated plate and the backwall.

Figure 3A:
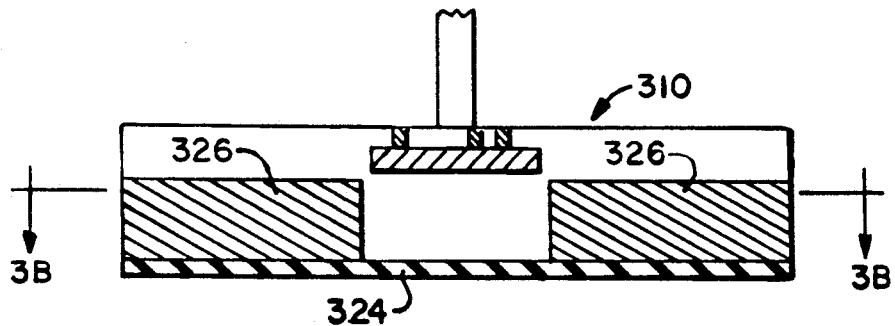
FIGS. 3a, 3b and FIGS. 4a, 4b show alternate embodiments of the device of FIG. 2.
Figure 3B:
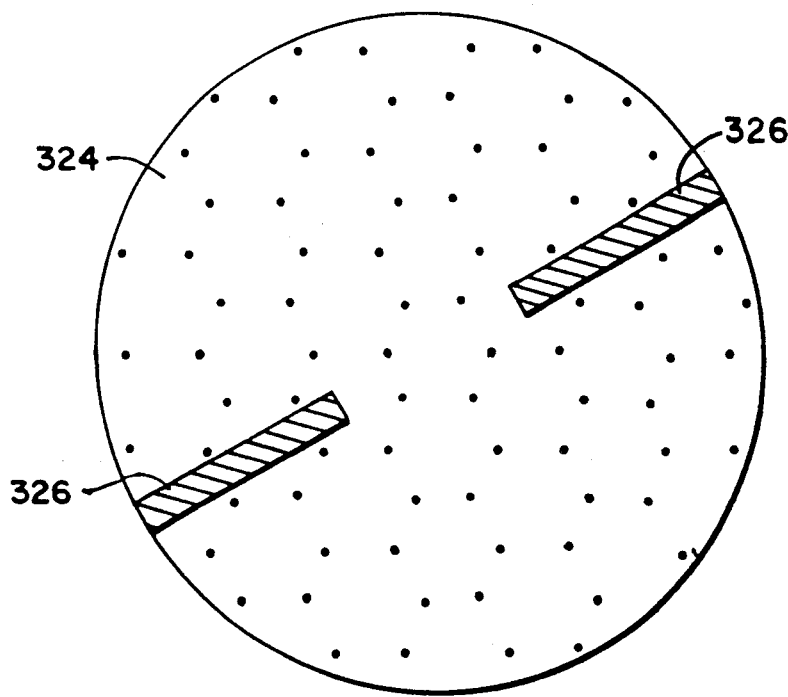

FIG. 3a shows a fluid distribution head 310 which includes internal supports 326 extending from the side wall toward the center of the perforated plate 324. FIG. 3b shows a view of the fluid distribution head of FIG. 3a, taken through line 3b—3b. The internal supports 326 are designed to minimize interference with the fluid distribution through the perforated plate 324.

Figure 4A:
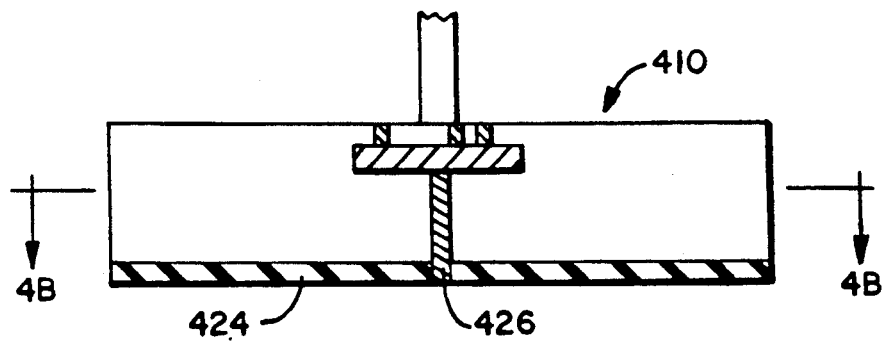
Figure 4B:
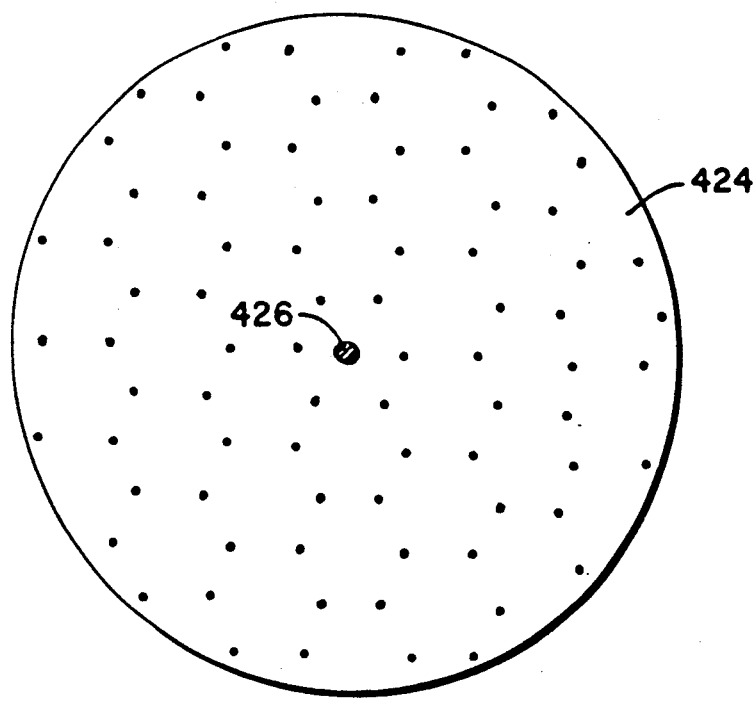

FIG. 4a shows a fluid distribution head 410 which includes an internal support 426 extending from the baffle plate 418 to the center of the perforated plate 424. FIG. 4b shows a view of the fluid distribution head of FIG. 4a, taken through line 4b—4b. The internal support 426, in conjunction with the baffle plate 418 and the baffle supports 420, minimizes interference with the fluid distribution through the perforated plate 424 while providing structural support from the backwall to the center of the perforated plate 424.

In a structure similar to that shown in FIG. 4, the baffle support posts can extend through the baffle plate to the perforated plate. The baffle supports thus function as both the baffle supports and as the internal supports (not shown).

Figure 5:
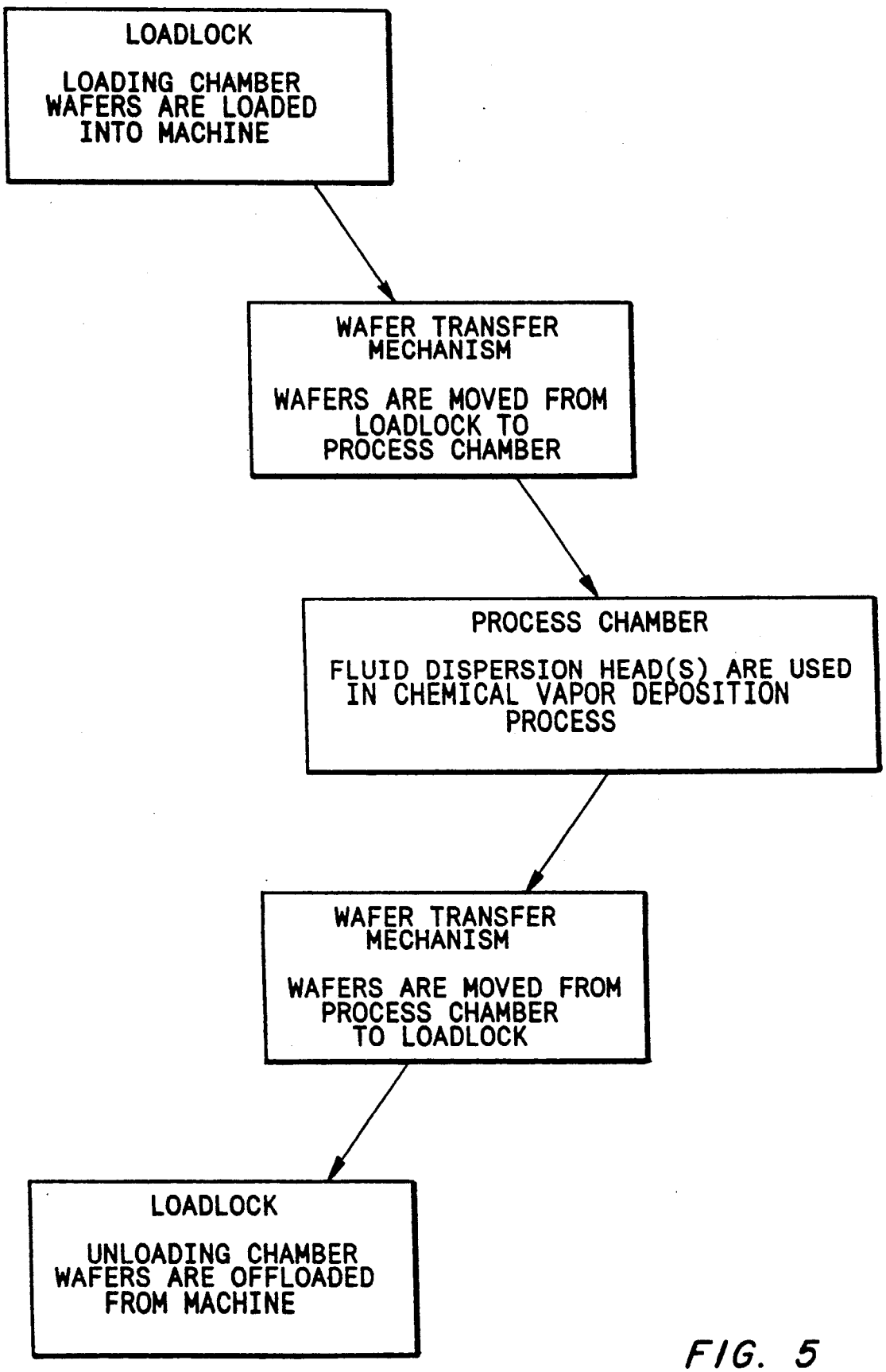
FIG. 5 is a block diagram of a device which is appropriate for use with the fluid dispenser head of the subject invention.

FIG. 5 shows a block diagram of an apparatus which uses one or more fluid distribution head of the subject invention in a CVD process for the manufacture of integrated circuits. While extensive reference is made herein to the manufacture of integrated circuits, it is to be understood that such reference is for clarity of explanation only, and that the fluid dispersion head and methods of this invention, and apparatus including the fluid dispersion head of this invention, find use in a variety of CVD, LPCVD, and other environments.

An apparatus such as that shown in FIG. 5 can operate in a batch, semi-batch, or continuous mode. When integrated circuits are manufactured, silicon wafers or partially manufactured integrated circuits (hereinafter "silicon wafers") are loaded into the apparatus for further processing.

The loadlock is a loading chamber into which silicon wafers are loaded. Such loading chambers are well known in the art. In a preferred apparatus, from one to three silicon wafer casettes are loaded at one time,
where each cassette can hold up to 25 wafers. The silicon wafers are moved, one at a time, by the wafer transfer medium, and loaded into the process chamber. A variety of wafer transfer mechanisms are well known to the art.

The process chamber includes at least one fluid distribution head. CVD processes occur within the process chamber. Specific parameters of temperature and pressure for CVD and LPCVD processes are well known in the art, as are fluid media for use in CVD processes. Temperatures for CVD processes range from ambient temperatures (approximately 20° C.) up to 1400° C. When the fluid dispersion head is made of aluminum the temperature will generally be below 660° C., and preferably below 600° C. Temperatures for many CVD processes range from about 100° C. to about 500° C. Pressures range from vacuum and partial vacuum to atmospheric pressure and above. Pressure gradients can vary within an apparatus. For example, the loadlock area can cycle between atmospheric pressure and 50–100 mTorr while the process chamber is maintained at 2.2 Torr. Various fluid media for CVD use are well known in the art. For example, one known fluid media for depositing a layer of silicon nitride comprises 200 parts silane, 3500 parts nitrogen, and 5000 parts ammonia (all parts by volume).

After the silicon wafer has been processed, it is removed from the process chamber by a wafer transfer mechanism and delivered to an unloading chamber (loadlock) where it is removed from the apparatus.

Figure 6B:
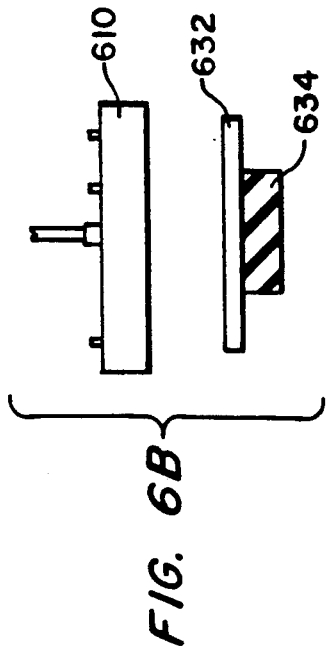
FIG. 6a, 6b are a graphic representation of a CVD device which includes fluid dispersion heads of the subject invention.
Figure 6A:
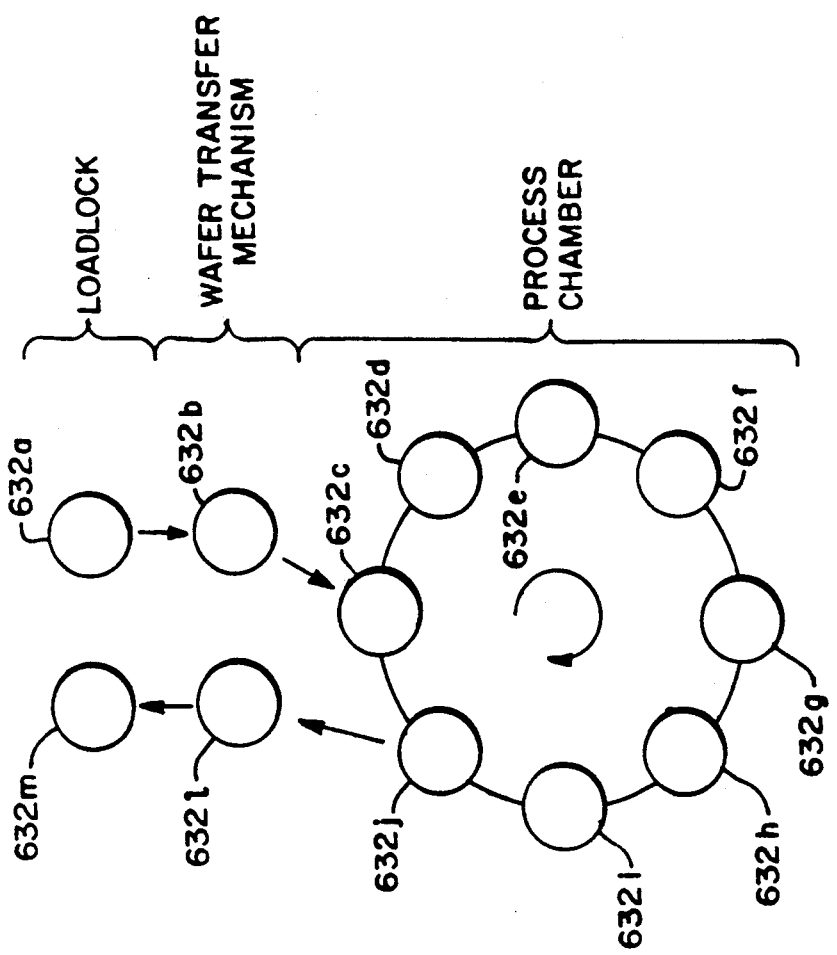

FIGS. 6 and 6b show a simplified graphic of a device for use with the improved fluid dispersion heads herein. Silicon wafers 632a are loaded into the apparatus, either manually or mechanically, at the loadlock. The wafer transfer mechanism (a conveyor belt, an arm, or the like) transports a silicon wafer 632b to the first position of the process chamber, where the silicon wafer 632c is loaded onto a spindle arm.

In a preferred apparatus there are eight positions defined by spindle arms around a rotating spindle within the process chamber. Each position holds one silicon wafer. At each position within the process chamber is a fluid distribution head of the invention herein suspended above the spindle. The spindle arms are rotated, causing each silicon wafer to progress into position under each fluid dispersion head. The Novellus Concept One device includes eight positions, only seven of which are active. (The eighth position is for loading and unloading of wafers). In continuous batch processing, each wafer is loaded and unloaded at position 1 (silicon wafer 632c). Each silicon wafer is then rotated through each position, as shown by chips 632d through 632j. At each position a CVD process occurs. For example, when a 1μ layer is to be deposited in a continuous process, approximately 1/7 of the deposition (9,000 to 13,000 angstroms thick) is applied at each station. The silicon wafer 632j is then returned to position 1, where it is offloaded by the wafer transfer mechanism (shown by silicon wafer 632k), and removed to the offloading chamber (shown by silicon wafer 632m).

An enlarged side-view graphic of one position within the process chamber is shown in FIG. 6b. The fluid dispersion head 610 is suspended above a rotating spindle assembly. A wafer 632 is transferred to the position by a spindle fork 634, which is attached to a rotating spindle (not shown). The fluid dispersion head 610 is suspended in position using three adjustable supports (not shown).

EXAMPLE 1

Prior Art Fluid Distribution Head for CVD Use

A fluid distribution head is made. It is made in two subunits, which are then assembled by soldering. The head is milled from Aluminum 6061.

The first subunit includes the perforated plate. The perforated plate is circular and has an outside diameter of 6.970 inches. The perforations are in a honeycomb pattern in which there are six circular perforations, each having a diameter of 0.040 inches, which lie equidistant around the circumference of a circle having a diameter of 0.325. The pattern repeats across the surface of the perforated plate. The perforated plate is 0.100 inches thick.

A side wall extends from the edge of the perforated plate. It is perpendicular to the plane of the perforated plate, and is 0.680 inches tall and 0.20 inches thick.

The second subunit includes the backplate, baffle plate and baffle supports, and internal supports. The backplate has a diameter of 6.970. It is generally 0.170 inches thick. It has a narrowed lip around its circumference which mates with the side wall of the first subunit with a pressure fit. A nipple fitting for receiving the inlet shaft is present in the center of the outer surface of the plate. The inlet shaft is approximately 6.420 inches in length. The diameter of the outer surface of the inlet tube is approximately 0.375 inches, and the diameter of the inner surface of the inlet tube is approximately 0.315 inches. It is preliminarily affixed by pressure-fitting, and is then soldered in place.

Three 0.126 inch openings in the backplate are present equidistantly placed along the circumference of a circle having a radius 0.750 inches from the center of the plate. The baffle supports are fixed within these holes. Each of the baffle supports is an aluminum pin having a length of approximately 0.370 inches and a diameter of approximately 0.126 inches. The baffle supports are inserted into the holes, welded, and milled flat at the outside surface. The baffle plate is an aluminum plate having a diameter of approximately 2.00 inches and a thickness of approximately 0.062 inches. There are three holes in the baffle plate which correspond to the baffle support posts. The baffle supports are inserted into the corresponding holes in the baffle plate, welded, and milled flat at the outside surface.

The two subunits are mated, and then soldered together to form the finished unit.

The outside of the fluid dispersion head can include one or more (usually three) internally-threaded nipples. These connections are used to adjust the height of the fluid dispersion head over the workpiece below it.

EXAMPLE 2

Improved Fluid Distribution Head

A fluid distribution head is made. It is made in two subunits, which are then assembled by soldering. The head is milled from Aluminum 6061 (Alcoa).

The first subunit includes the perforated plate. The perforated plate is circular and has an outside diameter of 6.970 inches. The perforations are in a honeycomb pattern in which there are six circular perforations, each having a diameter of 0.040 inches, which lie equidistant around the circumference of a circle having a diameter of 0.325. The pattern repeats across the surface of the perforated plate. The perforated plate is 0.100 inches thick. Nine holes are drilled at a distance of 2.276 inches from the center of the plate. The internal supports will be fitted into these nine holes. Each hole is 0.130 inches in diameter. The support holes are placed so that they do not overlap any perforations already present in the perforated plate.

A side wall extends from the edge of the perforated plate. It is perpendicular to the plane of the perforated plate, and is 0.680 inches tall and 0.20 inches thick.

The second subunit includes the backplate, baffle plate and baffle supports, and internal supports. The backplate has a diameter of 6.970. It is generally 0.170 inches thick. It has a narrowed lip around its circumference which mates with the side wall of the first subunit in a pressure fit. A nipple fitting for receiving the inlet shaft is present in the center of the outside of the plate. The inlet shaft is approximately 6.420 inches in length. The diameter of the outer surface of the tube is approximately 0.375 inches, and the diameter of the inner surface of the tube is approximately 0.315 inches. It is preliminarily affixed by pressure-fitting, and is then soldered in place.

Three 0.126 inch openings in the backplate are present equidistantly placed along the circumference of a circle having a radius 0.750 inches from the center of the plate. The baffle supports are fixed within these holes. Each of the baffle supports is an aluminum pin having a length of approximately 0.370 inches and a diameter of approximately 0.126 inches. The baffle supports are inserted into the holes, welded, and milled flat at the outside surface. The baffle plate is an aluminum plate having a diameter of approximately 2.00 inches and a thickness of approximately 0.062 inches. There are three holes in the baffle plate which correspond to the baffle support posts. The baffle supports are inserted into the corresponding holes in the baffle plate, welded, and milled flat at the outside surface.

Nine 0.126 inch openings in the backplate are present equidistantly placed along the circumference of a circle having a radius 2.276 inches from the center of the plate. The internal support pegs are placed within these openings. Each of the internal support pegs is an aluminum pin having a length of approximately 0.850 inches and a diameter of approximately 0.126 inches. The internal support pegs are inserted into the holes, welded, and milled flat at the outside surface. The free ends of the internal support pegs are then inserted into the corresponding holes in the perforated plate, welded, and milled flat at the outside surface. This mates the two parts. The two parts are then soldered together to form the finished unit.

The outside of the fluid dispersion head can include one or more (usually three) internally-threaded nipples. These connections are used to adjust the height of the fluid dispersion head over the workpiece below it.

EXAMPLE 3

Alternate Improved Fluid Distribution Head

The procedures of Example 2 are repeated, except that three internal supports are provided.

EXAMPLE 4

Use of Prior Art Fluid Distribution Head

Eight separate fluid dispersing heads according to Example 1 are inserted into a Novellus Concept One CVD machine. The machine is used according to manufacturer's instructions. The ambient temperature at the fluid dispersing heads is approximately 400° C., and the environment includes a partial vacuum. After four months use the heads are removed and checked for deformation. The deformation is measured at more than 0.030 inches from the planar in each of the eight of the fluid dispersing heads. This constitute failure mode, and the fluid dispersing heads are removed.

EXAMPLE 5

Use of Improved Fluid Distribution Head

Eight separate fluid dispersing heads according to Example 2 are inserted into a Novellus Concept One CVD machine. The machine is used according to manufacturer's instructions. The ambient temperature at the fluid dispersing heads is approximately 400° C., and the environment includes a partial vacuum. After four months use the heads are removed and checked for deformation. The deformation is measured at less than 0.020 inches from the planar in each of the fluid dispersing heads. After two years of almost-constant use the heads are removed and checked for deformation. The deformation is measured at less than 0.020 inches from the planar in each of the fluid dispersing heads.

EXAMPLE 6

Use of Alternate Improved Fluid Distribution Head

The procedures of Example 5 are repeated, substituting fluid dispersing heads of Example 3 for those of Example 2. The deformation is measured at less than 0.020 inches in each of the fluid dispersing heads after four months use. After two years of use the deformation is measured at less than 0.020 inches from the planar.

While the invention has been described in connection with specific embodiments thereof, those skilled in the art will recognize that various modifications are possible within the principles described herein. Such modifications, variations, uses, or adaptations of the invention, including such departures from the present disclosure as come within known or customary practice in the art, fall within the scope of the invention and of the appended claims.

I claim:

1. A method for chemical vapor deposition comprising:
   (a) providing a fluid, said fluid including at least one substance to be deposited onto a substrate, to an intake aperture of a fluid deposition head, the fluid deposition head consisting essentially of:
      (i) a chamber for fluid flow being defined by a relatively rigid housing having an aperture at one end of the housing for the intake of a fluid, and a perforated outlet plate at an opposite end of the housing for the discharge of fluids;
      (ii) a single, non-perforated baffle plate disposed within the chamber between the aperture and the perforated outlet plate, said baffle plate acting to disperse the fluid which enters the chamber, said baffle plate supported exclusively by a first support structure disposed within the housing and extending between an interior area of the baffle plate and the housing, the first support structure having a one end fixed to the housing and another opposite end fixed to the baffle plate; and
      (iii) a second support structure, distinct from the first support structure, disposed within the chamber, and extending between the housing and an interior area of the outlet plate;
   wherein fluid provided at the intake aperture is distributed substantially evenly across the perforated outlet plate; and
   (b) depositing the fluid from the outlet plate evenly onto the substrate.

2. A method, according to claim 1, wherein: the chemical vapor deposition process is a low pressure chemical vapor deposition (LPCVD) process.

3. A method, according to claim 1, wherein: the chemical vapor deposition process deposits a layer of one or more materials onto a silicon wafer.

4. A method, according to claim 1, wherein: the chemical vapor deposition process deposits a layer of one or more materials onto an integrated circuit.

5. A method, according to claim 1, wherein: the fluid is a gas.

6. A method, according to claim 1, wherein: the substance to be deposited is selected from the group consisting of silane based oxides, doped oxides, TEOS oxides, nitrides, oxynitrides, tungsten, and UV transparent nitrides.

7. A method, according to claim 1, wherein: the second support structure is at least one rod.

8. A method, according to claim 1, wherein: the second support structure is at least one planar member.

9. A method, according to claim 1, wherein: the depositing step is conducted at a temperature between about 200° C. and about 600° C.

10. A method, according to claim 7, wherein: the second support structure is a plurality of rods extending from an interior area of the outlet plate to a back wall at the one end of the housing.

11. A method, according to claim 10, wherein: there are provided a plurality of rods extending from evenly-spaced positions on the interior area of the outlet plate to the back wall of the housing.

12. A method, according to claim 1, wherein: the second support structure is at least one planar member extending between a side wall of the housing and an interior area of the outlet plate.

13. A method, according to claim 12, wherein: the second support structure is two diametrically-opposed planar members extending between a side wall of the housing and two diametrically-opposed interior areas of the outlet plate.

14. A method for depositing a desired substance on a silicon wafer comprising:
   (a) placing a silicon wafer in a chemical vapor deposition chamber; and
   (b) delivering a vapor including the desired substance to be deposited upon the silicon wafer to the vapor deposition chamber by means of a fluid deposition head, said fluid deposition head consisting essentially of:
      (i) a chamber for fluid flow being defined by a relatively rigid housing having an aperture at one end of the housing for the intake of a fluid, and a perforated outlet plate at an opposite end of the housing for the discharge of fluids;
      (ii) a single, non-perforated baffle plate disposed within the chamber between the aperture and the perforated outlet plate, said baffle plate acting to disperse the fluid which enters the chamber, said baffle plate supported exclusively by a first support structure disposed within the housing and extending between an interior area of the baffle plate and the housing, the first support structure having a one end fixed to the housing and another opposite end fixed to the baffle plate; and (iii) a second support structure, distinct from the first support structure, disposed within the chamber, and extending between the housing and an interior area of the outlet plate.

15. A method, according to claim 14, wherein:
said silicon wafer further comprises an integrated circuit.

16. A method, according to claim 14, wherein:
the substance to be deposited is selected from the group consisting of silane based oxides, doped oxides, TEOS oxides, nitrides, oxynitrides and UV transparent nitrides.

17. A method, according to claim 14, further comprising:
removing the silicon wafer from the chemical vapor deposition chamber after the desired substance is deposited on the wafer.

18. A method, according to claim 14, wherein:
the second support structure is at least one rod.

19. A method, according to claim 14, wherein:
the second support structure is at least one planar member.

20. A method, according to claim 14, wherein:
the chemical vapor deposition chamber is maintained at a temperature between about 200° C. and about 600° C. for the duration of a chemical vapor deposition process.

21. A method, according to claim 14, wherein:
the fluid is a gas.

22. A method, according to claim 14, wherein:
the fluid is a vapor.

* * * * *